(12) United States Patent
Matsuura

(10) Patent No.: US 7,283,795 B2
(45) Date of Patent: Oct. 16, 2007

(54) RECEIVER DEVICE HAVING IMPROVED SELECTIVITY CHARACTERISTICS

(75) Inventor: Shuuji Matsuura, Ikoma (JP)

(73) Assignee: Sharp Kabushiki Kaisha, Osaka (JP)

( * ) Notice: Subject to any disclaimer, the term of this patent is extended or adjusted under 35 U.S.C. 154(b) by 409 days.

(21) Appl. No.: 10/951,762

(22) Filed: Sep. 29, 2004

(65) Prior Publication Data

US 2005/0070235 A1  Mar. 31, 2005

(30) Foreign Application Priority Data

Sep. 30, 2003  (JP)  ............................. 2003-339488

(51) Int. Cl.
*H04B 1/18* (2006.01)
(52) U.S. Cl. ................. 455/180.2; 455/188.2
(58) Field of Classification Search ............ 455/178.1, 455/188.2–191.3, 180.2, 180.4, 193.1, 193.2, 455/193.3, 194.2, 197.2, 197.3; 348/731, 348/733
See application file for complete search history.

(56) References Cited

U.S. PATENT DOCUMENTS 4,326,295 A * 4/1982 Matsumoto et al. ..... 455/188.2
4,577,171 A * 3/1986 Heigl et al. ..................... 334/1

FOREIGN PATENT DOCUMENTS

| JP | 3-128339 U | 12/1991 |
| JP | 4-369918 A | 12/1992 |
| JP | 6-253226 A | 9/1994 |
| JP | 8-181556 A | 7/1996 |

\* cited by examiner

*Primary Examiner*—Lee Nguyen
(74) *Attorney, Agent, or Firm*—Birch, Stewart, Kolasch & Birch, LLP (57) ABSTRACT

In a UHF band operation, a Bu terminal supplies a power supply voltage, and a (BL+BH) terminal does not supply the power supply voltage. Thereby, switching diodes are turned on, and a switching diode is turned off. In the UHF band operation, only a UHF signal in a signal provided from an ANT terminal is output to a UHF input tuning circuit. In a VHF band operation, the (BL+BH) terminal supplies the power supply voltage, and the Bu terminal does not supply the power supply voltage. Consequently, the switching diode is turned on, and the switching diodes are turned off. In the VHF band operation, only a VHF signal in the signal provided from the ANT terminal is output to a VHF input tuning portion via a filter portion.

8 Claims, 10 Drawing Sheets

RECEIVER DEVICE HAVING IMPROVED SELECTIVITY CHARACTERISTICS

This nonprovisional application is based on Japanese Patent Application No. 2003-339488 filed with the Japan Patent Office on Sep. 30, 2003, the entire contents of which are hereby incorporated by reference.

BACKGROUND OF THE INVENTION

1. Field of the Invention

The present invention relates to a receiver device, and particularly to a receiver device employing a single conversion system.

2. Description of the Background Art

Fifty years have passed since analog television broadcasting started, and twenty to thirty millions of homes have television sets at present. In Japan, digital terrestrial broadcasting finally started in the year 2003, and analog broadcasting will end in the year 2001. Cable television and BS (Broadcasting Satellite) are being switched to digital systems.

A tuner for receiving television signals have receiver circuits dedicated to different bands, respectively, and for example, a tuner for the United States has receiver circuits, which are dedicated to a UHF (Ultra High Frequency) band of 470-860 MHz, a VHF (Very High Frequency) high band of 170-470 MHz and a VHF low band for 54 to 170 MHz. However, the manner of dividing the bands depends on destinations of products, and is not particularly defined. Conventional tuners for receiving television signals generally employ a single conversion system (superheterodyne system).

Figure 10:
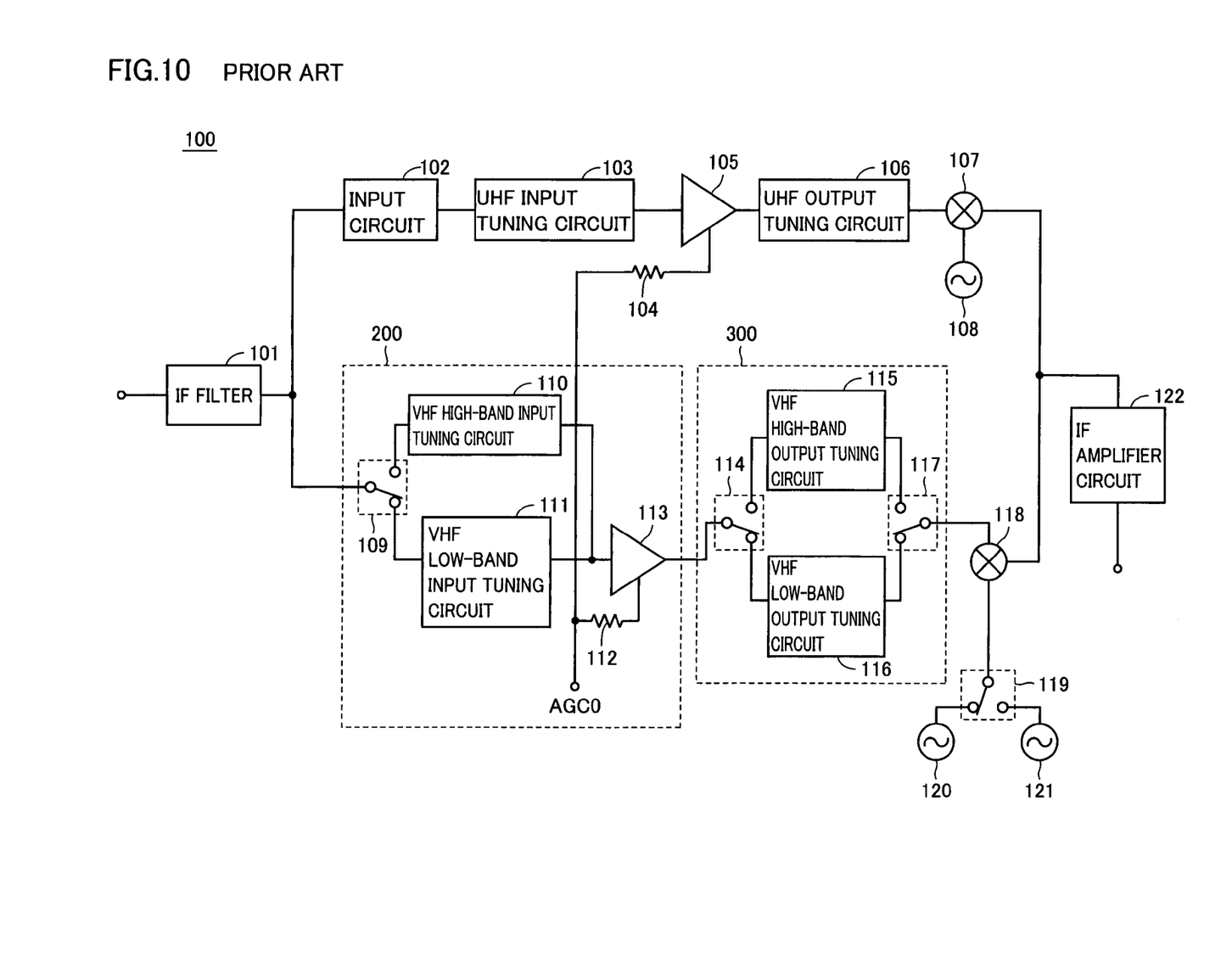
FIG. 10 is a schematic block diagram showing a conventional tuner 100 of a single conversion type.

FIG. 10 is a schematic block diagram schematically showing a block structure of a conventional tuner 100 of a single conversion type.

Referring to FIG. 10, conventional tuner 100 of the single conversion type includes an IF (Intermediate Frequency) filter 101, an input circuit 102, a UHF input tuning circuit 103, an AGC (Automatic Gain Control) resistance 104, a UHF high-frequency amplifier 105, a UHF output tuning circuit 106, a UHF mixer circuit 107, a UHF local oscillator circuit 108, a VHF mixer circuit 118, a local oscillation signal select switch 119, VHF local oscillator circuits 120 and 121, an IF amplifier circuit 122, a VHF input tuning portion 200 and a VHF output tuning portion 300.

IF filter 101 is a high-pass filter, which allows passage of only a high frequency portion, e.g., of 54 MHz or higher of a television signal received from an input terminal (antenna terminal). Input circuit 102 extracts a UHF signal from the television signal passed through IF filter 101. UHF input tuning circuit 103 performs input tuning of the UHF signal extracted by input circuit 102. AGC resistance 104 is connected between an AGC0 terminal and UHF high-frequency amplifier 105. The AGC0 terminal receives a gain control signal from a video signal demodulation circuit (not shown).

UHF high-frequency amplifier 105 receives the gain control voltage applied from AGC0 terminal via AGC resistance 104, and amplifies the UHF signal, which underwent the input tuning by UHF input tuning circuit 103. UHF output tuning circuit 106 performs output tuning of UHF signal amplified by UHF high-frequency amplifier 105. UHF mixer circuit 107 receives a local oscillation signal from UHF local oscillator circuit 108, and provides an IF signal by performing frequency conversion of the UHF signal, which underwent the output tuning by UHF output tuning circuit 106.

VHF input tuning portion 200 receives the VHF signal in the television signal passed through IF filter 101. VHF input tuning portion 200 includes a high/low band select switch 109, a VHF high-band input tuning circuit 110, a VHF low-band input tuning circuit 111, an AGC resistance 112 and a VHF high-frequency amplifier 113.

High/low band select switch 109 selects the VHF signal as a VHF high-band signal or a VHF low-band signal. VHF high-band input tuning circuit 110 performs input tuning of the VHF high-band signal. VHF low-band input tuning circuit 111 performs input tuning of the VHF low-band signal. AGC resistance 112 is connected between the AGC0 terminal and VHF high-frequency amplifier 113. VHF high-frequency amplifier 113 receives the gain control voltage applied from the AGC0 terminal via AGC resistance 112, and amplifies the VHF signals, which underwent the input tuning by VHF high-band input tuning circuit 110 and VHF low-band input tuning circuit 111.

VHF high-frequency amplifier 113 provides the VHF signal amplified thereby to VHF output tuning portion 300. VHF output tuning portion 300 includes high/low band select switches 114 and 117, a VHF high-band output tuning circuit 115 and a VHF low-band output tuning circuit 116.

High/low band select switch 114 selects the VHF signal amplified by VHF high-frequency amplifier 113 to provide it as a VHF high-band signal or a VHF low-band signal. VHF high-band output tuning circuit 115 performs the output tuning of the VHF high-band signal. VHF low-band output tuning circuit 116 performs the output tuning of the VHF low-band signal. High/low band select switch 117 performs the switching between the VHF high-band signal output-tuned by VHF high-band output tuning circuit 115 and the VHF low-band signal output-tuned by VHF low-band output tuning circuit 116.

VHF mixer circuit 118 receives a local oscillation signal sent from VHF local oscillator circuit 120 or a local oscillation signal sent from VHF local oscillator circuit 121, and provides the IF signal by performing the frequency conversion of the VHF signal, which underwent the output tuning by VHF output tuning portion 300. Local oscillation signal select switch 119 selects the local oscillation signal sent from VHF local oscillator circuit 120 and the local oscillation signal sent from VHF local oscillator circuit 121 depending on whether the VHF signal is a high-band signal or a low-band signal. IF amplifier circuit 122 amplifies the IF signal, which underwent the frequency conversion by UHF mixer circuit 107 or VHF mixer circuit 118, and provides it to an output terminal.

In conventional tuner 100 of the single conversion type, a PLL (Phase Locked Loop) circuit (not shown) performs a practical tuning or channel selecting operation. A portion of a specific circuit structure of tuner 100 will now be described.

Figure 11:
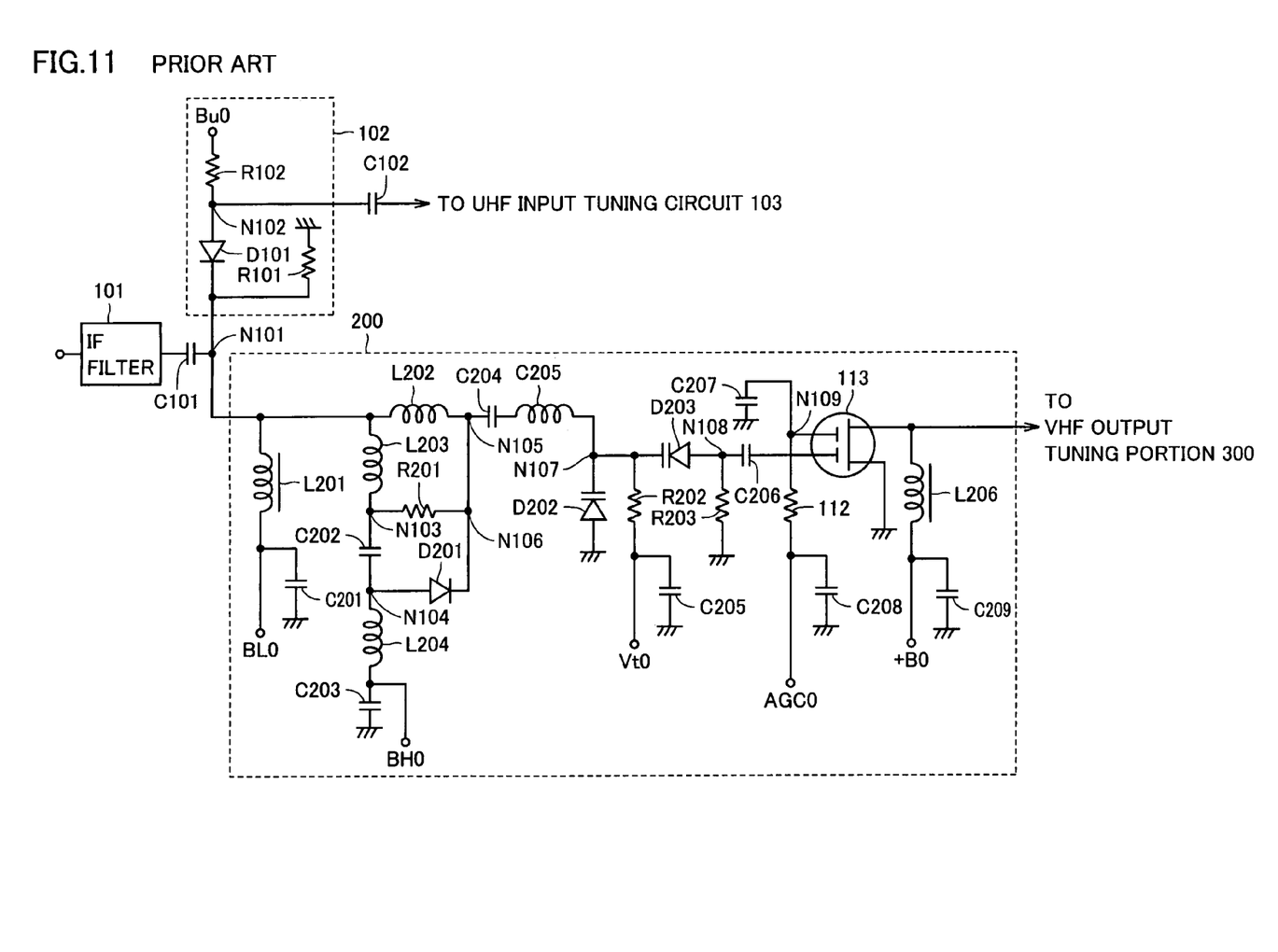
FIG. 11 is a circuit diagram showing a portion of a specific circuit structure of the conventional tuner 100 of the single conversion type.

FIG. 11 is a circuit diagram fragmentarily showing the specific circuit structure of conventional tuner 100 of the single conversion type.

Referring to FIG. 11, conventional tuner 100 of the single conversion type includes IF filter 101, input circuit 102 and VHF input tuning portion 200. IF filter 101 is connected to input circuit 102 and VHF input tuning portion 200 via a DC blocking capacitor C101.

Input circuit 102 includes a UHF/VHF switching diode D101, and bias resistances R101 and R102. UHF/VHF switching diode D101 is connected between nodes N101 and N102, and is arranged in the forward direction with respect to node N101. Bias resistance R101 is connected between node N101 and a ground node. Bias resistance R102 is connected between node N102 and a BuO terminal. The BuO terminal is a power supply terminal for the UHF signal. Input circuit 102 (node N102) is connected to UHF input tuning circuit 103 via a DC blocking capacitor C102 (see FIG. 10).

VHF input tuning portion 200 includes RF(Radio Frequency) choke coils L201 and L206, bypass capacitors C201, C203, C205 and C207-C209, a VHF low-band tuning coil L202, a VHF low-band matching coil L203, a damping resistance R201, DC blocking capacitors C202, C204 and C206, a high/low band switching diode D201, a VHF high-band matching coil L204, a VHF high-band tuning coil L205, a tuning variable-capacitance diode D202 (i.e., a variable-capacitance diode for tuning), a coupling variable-capacitance diode D203 (i.e., a variable-capacitance diode for coupling), bias resistances R202 and E203, AGC resistance 112 and VHF high-frequency amplifier 113. VHF high-frequency amplifier 113 is a MOS type Field Effect Transistor (MOS FET).

RF choke coil L201 is connected between node N101 and a BL0 terminal. The BL0 terminal is a power supply terminal for the VHF low-band signal. Bypass capacitor C201 is connected between the BL0 terminal and the ground node. VHF low-band tuning coil L202 is connected between nodes N101 and N105. VHF low-band matching coil L203 is connected between nodes N101 and N103. Damping resistance R20 is connected between nodes N103 and N106. DC blocking capacitor C202 is connected between nodes N103 and N104.

High/low band switching diode D201 is connected between nodes N104 and N106, and is arranged in the forward direction with respect to node N106. VHF high-band matching coil L204 is connected between node N104 and a BH0 terminal. The BH0 terminal is a power supply terminal for the VHF high-band signal. Bypass capacitor C203 is connected between the BH0 terminal and the ground node. DC blocking capacitor C204 and VHF high-band tuning coil L205 are connected in series between nodes N105 and N107.

Tuning variable-capacitance diode D202 is connected between node N107 and the ground node, and is arranged in the forward direction with respect to node N107. Bias resistance R202 is connected between node N107 and a Vt0 terminal. The Vt0 terminal is a tuning terminal for VHF input tuning portion 200. Bypass capacitor C205 is connected between the Vt0 terminal and the ground node. Coupling variable-capacitance diode D203 is connected between nodes N107 and N108, and is arranged in the forward direction with respect to node N107. Bias resistance R203 is connected between node N108 and the ground node.

AGC resistance 112 is connected between a node N109 and the AGC0 terminal. The AGC0 terminal receives the gain control signal from the video signal demodulating circuit (not shown). Bypass capacitor C207 is connected between node N109 and the ground node. Bypass capacitor C208 is connected between the AGC0 terminal and the ground node. VHF high-frequency amplifier (MOS FET) 113 has a source connected to node N109, a drain connected to node N108 via DC blocking capacitor C206 and a back gate connected to the ground node.

RF choke coil L206 is connected between a gate of MOS FET 113 and a +B0 terminal. The +B0 terminal is a power supply terminal for VHF input tuning portion 200. Bypass capacitor C209 is connected between the +B0 terminal and the ground node. VHF input tuning portion 200 (gate of MOS FET 113) is connected to VHF output tuning portion 300 (see FIG. 10).

A conventional television tuner input circuit disclosed in Japanese Utility Model Laying-Open No. 03-128339 has disclosed a feature, in which a p-type high-pass filter formed of a coil and a capacitor is connected in series to a downstream end of a resonant trap formed of a coil and a capacitor, and an input tuning circuit is connected in series to a downstream end of the above high-pass filter via a coupling capacitor.

According to a conventional electronic-tuning tuner disclosed in Japanese Patent Laying-Open No. 04-369918, a voltage supply, which operates an IF amplifier circuit, applies a bias voltage to a gate of a dual gate MOS FET arranged for VHF and UHF amplifier circuits. This electronic-tuning tuner utilizes the fact that the cut-off characteristics during the off state of the dual gate MOS FET are improved when a bias voltage is applied, and thereby suppresses entry of harmonic components of the UHF channel signal into a mixer circuit during the VHF receiving operation as well as entry of harmonic components of the VHF channel signal in the mixer circuit during the UHF receiving operation.

In conventional tuner 100 of the single conversion type shown in FIG. 11, since a circuit corresponding to input circuit 102 on the UHF band side is not present on the VHF band side, an interference signal due to the UHF signal affects the VHF signal sent to VHF input tuning portion 200. This causes a problem in characteristics of selectivity of the received signal in VHF input tuning portion 200 when the VHF low-band signal is received.

Also, conventional tuner 100 of the single conversion type shown in FIG. 11 cannot achieve a sufficiently high image rejection ratio. This causes a problem in characteristics of selectivity of the received signal in VHF input tuning portion 200 when the VHF low-band signal or VHF high-band signal is received.

Further, according to conventional tuner 100 of the single conversion type shown in FIG. 11, tuning diode D202 and coupling variable-capacitance diode D203 are connected equivalently in parallel. This results in a problem that a large tracking deviation occurs when the VHF high-band signal is received. The tracking deviation is a deviation between a local oscillation frequency and a RF (Radio-Frequency) amplifier circuit.

Further, conventional tuner 100 of the single conversion type shown in FIG. 11 suffers from a problem that an interference ratio of about −40 dBc occurs when receiving a US6 channel (video frequency of 83.25 MHz and audio frequency of 87.75 MHz).

Further, conventional tuner 100 of the single conversion type shown in FIG. 11 suffers from a problem that it has a low resistance to interference at a frequency lower than the IF frequency of 5-40 MHz, and particularly at a frequency of 27 MHz in a CB (Citizen Band).

Further, conventional tuner 100 of the single conversion type shown in FIG. 11 suffers from a problem that sufficient removal characteristics cannot be achieved with respect to the UHF signal of a large amplitude in the operation of receiving the VHF signal.

The conventional television tuner input circuit disclosed in Japanese Utility Model Laying-Open No. 03-128339 and the conventional electronic-tuning tuner disclosed in Japanese Patent Laying-Open No. 04-369918 can overcome some of the foregoing problems, but cannot overcome all the foregoing problems. Further, manners of overcoming the problems are not restricted to those disclosed in these publications.

SUMMARY OF THE INVENTION

Accordingly, an object of the invention is to provide a receiver device having high selectivity characteristics for received signals.

According to the invention, a receiver device employing a single conversion system includes a high-frequency amplifier circuit performing high-frequency amplification of an input signal received from an antenna terminal; and a signal processing portion performing frequency conversion and amplification of a high-frequency signal provided from the high-frequency amplifier circuit. The high-frequency amplifier circuit includes an antenna input portion passing a high-frequency component of the input signal, and then performing switching depending on a first frequency band and a second frequency band lower than the first frequency band, a filter portion performing filtering processing on a signal in the second frequency band selected by the antenna input portion, and a second frequency band input tuning portion tuning and amplifying the signal in the second frequency band filtered by the filter portion.

Preferably, the antenna input portion includes a high-pass filter passing the high frequency component of the input signal, and an input switching circuit extracting a signal in the first frequency band from the signal passed through the high-pass filter when a power supply voltage for the first frequency band is supplied, and extracting a signal in the second frequency band from the signal passed through the high-pass filter when a power supply voltage for the second frequency band is supplied.

Preferably, the filter portion includes an IF filter passing the high-frequency component of the signal in the second frequency band extracted by the antenna input portion, and a trap circuit performing resonant trap by a parallel resonant structure on the signal in the second frequency band passed through the IF filter. The trap circuit is disabled as a result of non-operation of the parallel resonant structure when a power supply voltage is supplied from a first switching terminal, and is enabled as a result of operation of the parallel resonant structure when the power supply voltage is supplied from a second switching terminal.

Preferably, the second frequency band input tuning portion functions as a matching inductor together with the antenna input portion when a power supply voltage for a high band in the second frequency band is supplied, and functions as an m-derived low-pass filter when the power supply voltage for a low band in the second frequency band is supplied.

Preferably, the second frequency band input tuning portion is provided with a variable image trap circuit when a power supply voltage for a high band in the second frequency band is supplied, and is provided with an fixed image trap circuit when the power supply voltage for a low band in the second frequency band is supplied.

Preferably, the second frequency band input tuning portion includes a capacitor for correcting characteristics of tracking between the high frequency amplifier circuit and the signal processing portion when a power supply voltage for a high band in the second frequency band is supplied.

Preferably, the first frequency band is a UHF band.

Preferably, the second frequency band is a VHF band.

The invention can improve the selectivity characteristics for the received signal.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Embodiments of the invention will now be described with reference to the drawings. In the following description, the same or corresponding portions bear the same reference numbers, and description thereof is not repeated.

Figure 1:
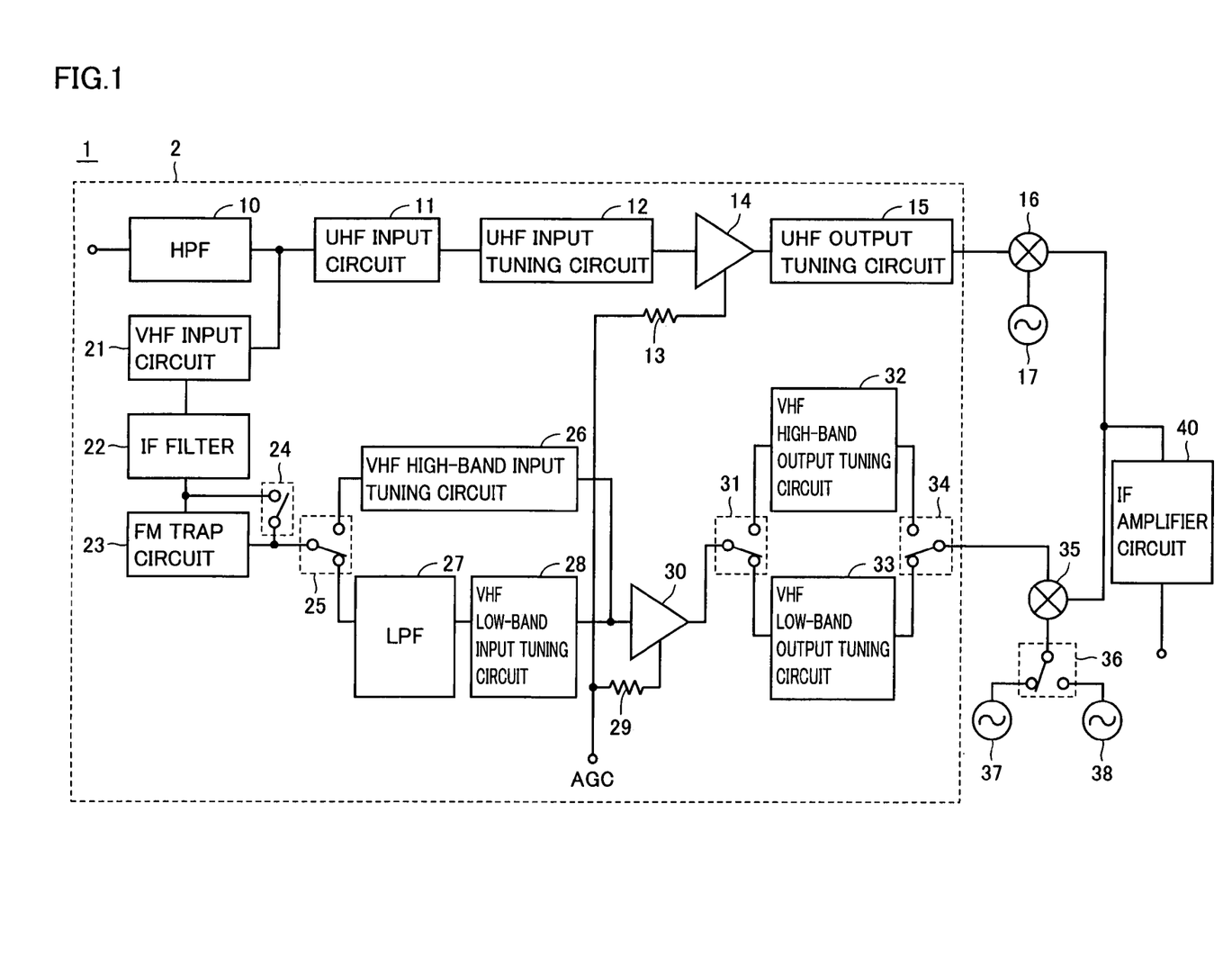
FIG. 1 is a schematic block diagram showing a schematic block structure of a tuner 1 of a single conversion type according to an embodiment of the invention.

FIG. 1 is a schematic block diagram showing a schematic block structure of a tuner 1 of a single conversion type according to an embodiment of the invention.

Tuner 1 according to the embodiment of the invention employs a single conversion system (superheterodyne system). Tuner 1 can be used for not only reception of conventional television broadcasting waves but also reception of digital terrestrial broadcasting waves and packet data of cable Internet utilizing cable television lines.

Referring to FIG. 1, tuner 1 according to the embodiment of the invention includes a high-frequency amplifier circuit 2, a UHF mixer circuit 16, a UHF local oscillator circuit 17, a VHF mixer circuit 35, a local oscillation signal select switch 36, VHF local oscillator circuits 37 and 38, and an IF amplifier circuit 40.

High-frequency amplifier circuit 2 includes a High-Pass Filter (HPF) 10, a UHF input circuit 11, a UHF input tuning circuit 12, AGC resistances 13 and 29, a UHF high-frequency amplifier 14, a UHF output tuning circuit 15, a VHF input circuit 21, an IF filter 22, an FM (Frequency Modulation) trap circuit 23, a trap select switch 24, high/low band select switches 25, 31 and 34, a VHF high-band input tuning circuit 26, a Low-Pass Filter (LPF) 27, a VHF low-band input tuning circuit 28, a VHF high-frequency amplifier 30, a VHF high-band output tuning circuit 32 and a VHF low-band output tuning circuit 33.

High-pass filter 10 allows passage of high-frequency components of a television signal received from an input terminal (antenna terminal). UHF input circuit 11 extracts the UHF signal from the television signal passed through high-pass filter 10. UHF input tuning circuit 12 performs input tuning of the UHF signal extracted by UHF input circuit 11. AGC resistance 13 is connected between an AGC terminal and UHF high-frequency amplifier 14. The AGC terminal receives a gain control signal from a video signal demodulating circuit (not shown).

UHF high-frequency amplifier 14 receives a gain control voltage applied from the AGC terminal via AGC resistance 13, and amplifies the UHF signal, of which input tuning is performed by UHF input tuning circuit 12. UHF output tuning circuit 15 performs the output tuning of UHF signal amplified by UHF high-frequency amplifier 14. UHF mixer circuit 16 receives the local oscillation signal from UHF local oscillator circuit 17, and provides the IF signal by performing frequency conversion of the UHF signal, which underwent the output tuning by UHF output tuning circuit 15.

VHF input circuit 21 extracts the VHF signal from the television signal passed through high-pass filter 10. IF filter 22 is a high-pass filter allowing passage of high-frequency components of the VHF signal extracted by VHF input circuit.21. In practice, UHF and VHF input circuits 11 and 21 are provided by a single circuit, which is switched between the UHF and VHF bands depending on application and non-application of the power supply voltage. FM trap circuit 23 further performs resonant trap of the high-frequency components including the VHF signal passed through IF filter 22. Trap select switch 24 controls whether the signal is to be passed through FM trap circuit 23 or not.

High/low band select switch 25 switches the VHF signal, which passed through IF filter 22 (and FM trap circuit 23), between the VHF high-band signal and the VHF low-band signal. VHF high-band input tuning circuit 26 performs input tuning of the VHF high-band signal. Low-pass filter 27 removes the high-frequency signal other than the VHF low-band signal. VHF low-band input tuning circuit 28 performs the input tuning of the VHF low-band signal. AGC resistance 29 is connected between the AGC terminal and VHF high-frequency amplifier 30. VHF high-frequency amplifier 30 receives the gain control voltage applied from the AGC terminal via AGC resistance 29, and amplifies the VHF signal, which underwent the input tuning by VHF high-band input tuning circuit 26 and VHF low-band input tuning circuit 28.

High/low band select switch 31 switches the VHF signal amplified by VHF high-frequency amplifier 30 between the VHF high-band signal and the VHF low-band signal. VHF high-band output tuning circuit 32 performs the output tuning of the VHF high-band signal. VHF low-band output tuning circuit 33 performs the output tuning of the VHF low-band signal. High/low band select switch 34 performs switching between VHF high-band signal output-tuned by VHF high-band output tuning circuit 32 and the VHF low-band signal output-tuned by VHF low-band output tuning circuit 33.

VHF mixer circuit 35 receives the local oscillation signal sent from VHF local oscillator circuit 37 or the local oscillation signal sent from VHF local oscillator circuit 38, and performs the frequency conversion of the VHF signal output-tuned by VHF high-band output tuning circuit 32 or VHF low-band output tuning circuit 33 to provide the IF signal. Local oscillation signal select switch 36 performs the switching between the local oscillation signal sent from VHF local oscillator circuit 37 and the local oscillation signal sent from VHF local oscillator circuit 38 depending on whether the VHF signal is a high-band signal or a low-band signal. IF amplifier circuit 40 amplifies the IF signal, which underwent the frequency conversion by UHF mixer circuit 16 or VHF mixer circuit 35, and provides it to an output terminal.

In practice, a PLL circuit (not shown) performs the tuning operation of tuner 1 shown in FIG. 1. Description will now be given on an example (a high-frequency amplifier circuit 2A) of a specific block structure of high-frequency amplifier circuit 2.

Figure 2:
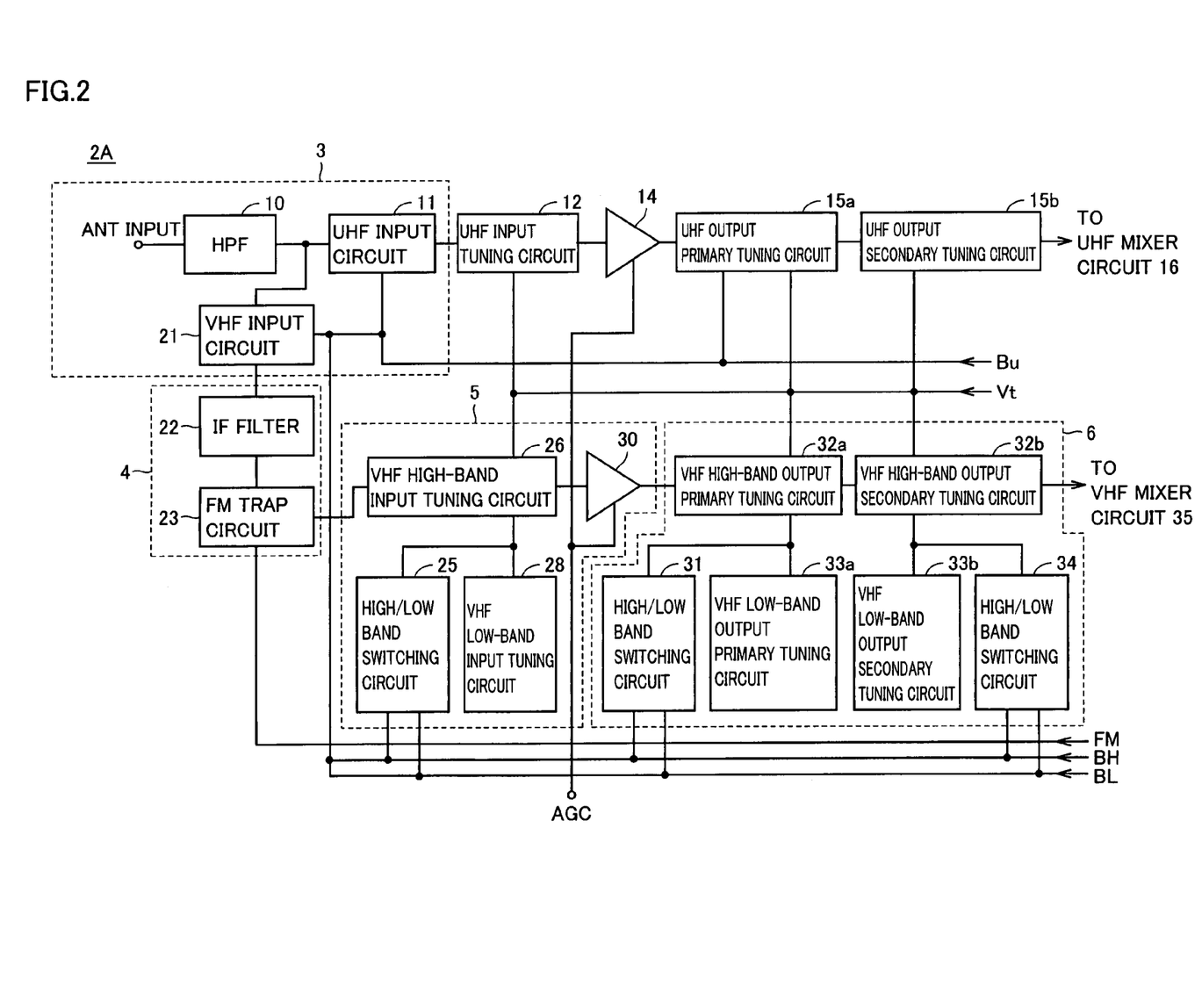
FIG. 2 is a block diagram showing a specific block structure of a high-frequency amplifier circuit 2A according to the invention.

FIG. 2 is a block diagram showing a specific block structure of high-frequency amplifier circuit 2A according to the embodiment of the invention.

Referring to FIG. 2, high-frequency amplifier circuit 2A includes an antenna input portion 3, UHF input tuning circuit 12, UHF high-frequency amplifier 14, a UHF output primary tuning circuit 15a, a UHF output secondary tuning circuit 15b, a filter portion 4, a VHF input tuning portion 5 and a VHF output tuning portion 6.

Antenna input portion 3 includes high-pass filter (HPF) 10, UHF input circuit 11 and VHF input circuit 21. High-pass filter 10 allows passage of high-frequency components of the television signal sent from the ANT (antenna) terminal. UHF input circuit 11 receives the power supply voltage of the UHF signal applied from a Bu terminal, and extracts the UHF signal from the television signal passed through high-pass filter 10. VHF input circuit 21 receives a power supply voltage of the VHF low-band signal applied from a BL terminal and a power supply voltage of the VHF high-band signal applied from a BH terminal, and extracts the VHF signal from the television signal passed through high-pass filter 10. In practice, a single circuit provides UHF and VHF input circuits 11 and 21, and performs switching between the UHF band and the VHF band depending of application/non-application of the respective power supply voltages from the Bu, BL and BH terminals.

In general, the ANT (antenna) terminal receives, in addition to the television signal, many interference signals others than the television signal, and more specifically receives AM (Amplitude Modulation) radio broadcasting waves in a LF (Low Frequency) band, short-wave broadcasting waves in a HF (High Frequency) band, CB (Citizen Band) waves, business radio waves and FM broadcasting waves as well as currently increasing waves of cellular phones and others. These many interference signals other than the television signal serve as distortion components with respect to the television signal, and may appear as window wiper disturbance or beat disturbance on an practical television screen. Therefore, antenna input portion 3 must remove these interference signals.

In tuner 1 of this embodiment of the invention, the UHF band is set to 470-860 MHz, and the VHF band is set to 50-470 MHz. By setting the UHF band to 470-860 MHz, it is possible in the operation of receiving the UHF signal to remove the signals of low frequencies in the VHF, FM, AM and other bands. By setting the VHF band to 50-470 MHz, it is possible in the operation of receiving the VHF signal to remove the signals of high frequencies in the UHF, microwave and other bands. These signal bands are discriminated by a circuit structure of antenna input portion 3, which will be specifically described later.

UHF input tuning circuit 12 receives the tuning voltage applied from a Vt terminal, and performs the input tuning of the UHF signal extracted by UHF input circuit 11. UHF high-frequency amplifier 14 receives the gain control voltage applied from the AGC terminal, and amplifies the UHF signal, which underwent the input tuning by UHF input tuning circuit 12. UHF output primary tuning circuit 15a receives the power supply voltage of the UHF signal applied from the Bu terminal and the tuning voltage applied from the Vt terminal, and performs the output tuning of the UHF signal amplified by UHF high-frequency amplifier 14. UHF output secondary tuning circuit 15b receives the tuning voltage applied from the Vt terminal, and further performs output tuning of the UHF signal output-tuned by UHF output primary tuning circuit 15a to provide the signal thus tuned to UHF mixer circuit 16 (see FIG. 1).

The VHF signal extracted by VHF input circuit 21 is sent to filter portion 4. Filter portion 4 includes IF filter 22 and FM trap circuit 23. IF filter 22 is a high-pass filter allowing passage of high-frequency components of the VHF signal extracted by VHF input circuit 21. FM trap circuit 23 receives a switching voltage applied from the FM terminal, and further performs resonant trap of the high-frequency components including the VHF signal passed through IF filter 22.

IF filter 22 and FM trap circuit 23 are both filters for removing interference signals. IF filter 22 removes radio interference signals of 50 MHz or lower such as field-through components of the IF signal, CB waves and AM radio broadcasting waves. FM trap circuit 23 removes the beat interference in US6 channel, which occurs in a tuner for the United States of America. The trap resonance frequency of FM trap circuit 23 is equal or close to the audio frequency of the US6 channel. A specific circuit structure of filter portion 4 achieving the above filtering will be described later.

The VHF signal, which is resonant-trapped by FP trap circuit 23, is provided to VHF input tuning portion 5. VHF input tuning portion 5 includes high/low band switching circuit 25, VHF high-band input tuning circuit 26, VHF low-band input tuning circuit 28 and VHF high-frequency amplifier 30.

High/low band select switch 25 receives the power supply voltage of the VHF low-band signal applied from the BL terminal as well as the power supply voltage of the VHF high-band signal applied from the BH terminal, and switches the VHF signal sent via IF filter 22 and FM trap circuit 23 between the VHF high-band signal and the VHF low-band signal. VHF high-band input tuning circuit 26 receives the tuning voltage applied from the Vt terminal, and performs the input tuning of the VHF high-band signal. VHF low-band input tuning circuit 28 receives the tuning voltage applied from the Vt terminal, and performs the input tuning of the VHF low-band signal. VHF high-frequency amplifier 30 receives the gain control voltage applied from the AGC terminal, and amplifies the VHF signals, of which input tuning is performed by VHF high-band input tuning circuit 26 and VHF low-band input tuning circuit 28.

A specific circuit structure of VHF input tuning portion 5, which achieves the foregoing tuning and amplification of the VHF signal as described above, will be described later in detail. The blocks representing the respective circuits and portions of VHF input tuning portion 5 are illustrated only conceptually, and each block does not necessarily correspond to one circuit in a practical structure. This is true also with respect to the other components in FIGS. 1 and 2.

The VHF signal, which is tuned and amplified by VHF input tuning portion 5, is applied to VHF output tuning portion 6. VHF output tuning portion 6 includes high/low band switching circuits 31 and 34, a VHF high-band output primary tuning circuit 32a, a VHF high-band output secondary tuning circuit 32b, a VHF low-band output primary tuning circuit 33a and a VHF low-band output secondary tuning circuit 33b.

High/low band select switch 31 receives the power supply voltage of the VHF low-band signal applied from the BL terminal and the power supply voltage of the VHF high-band signal applied from the BH terminal, and switches the VHF signal, which is amplified by VHF high-frequency amplifier 30, between the VHF high-band signal and the VHF low-band signal. VHF high-band output primary tuning circuit 32a receives the tuning voltage applied from the Vt terminal, and performs the output tuning of the VHF high-band signal. VHF low-band output primary tuning circuit 33a receives the tuning voltage applied from the Vt terminal, and performs the output tuning of the VHF low-band signal.

VHF high-band output secondary tuning circuit 32b receives the tuning voltage applied from the Vt terminal, and further performs output tuning of the VHF high-band signal, which underwent the output tuning by VHF high-band output primary tuning circuit 32a. VHF low-band output secondary tuning circuit 33b receives the tuning voltage applied from the Vt terminal, and further performs the output tuning of the VHF low-band signal, which underwent the output tuning by VHF low-band output primary tuning circuit 33a.

High/low band select switch 34 receives the power supply voltage of the VHF low-band signal applied from the BL terminal and the power supply voltage of the VHF high-band signal applied from the BH terminal, and selectively outputs the VHF high-band signal output-tuned by VHF high-band output secondary tuning circuit 32b and the VHF low-band signal output-tuned by VHF low-band output secondary tuning circuit 33b (see FIG. 1). Then, specific circuit structures and operations of antenna input portion 3, filter portion 4 and VHF input tuning portion 5 will be successively described.

Figure 3:
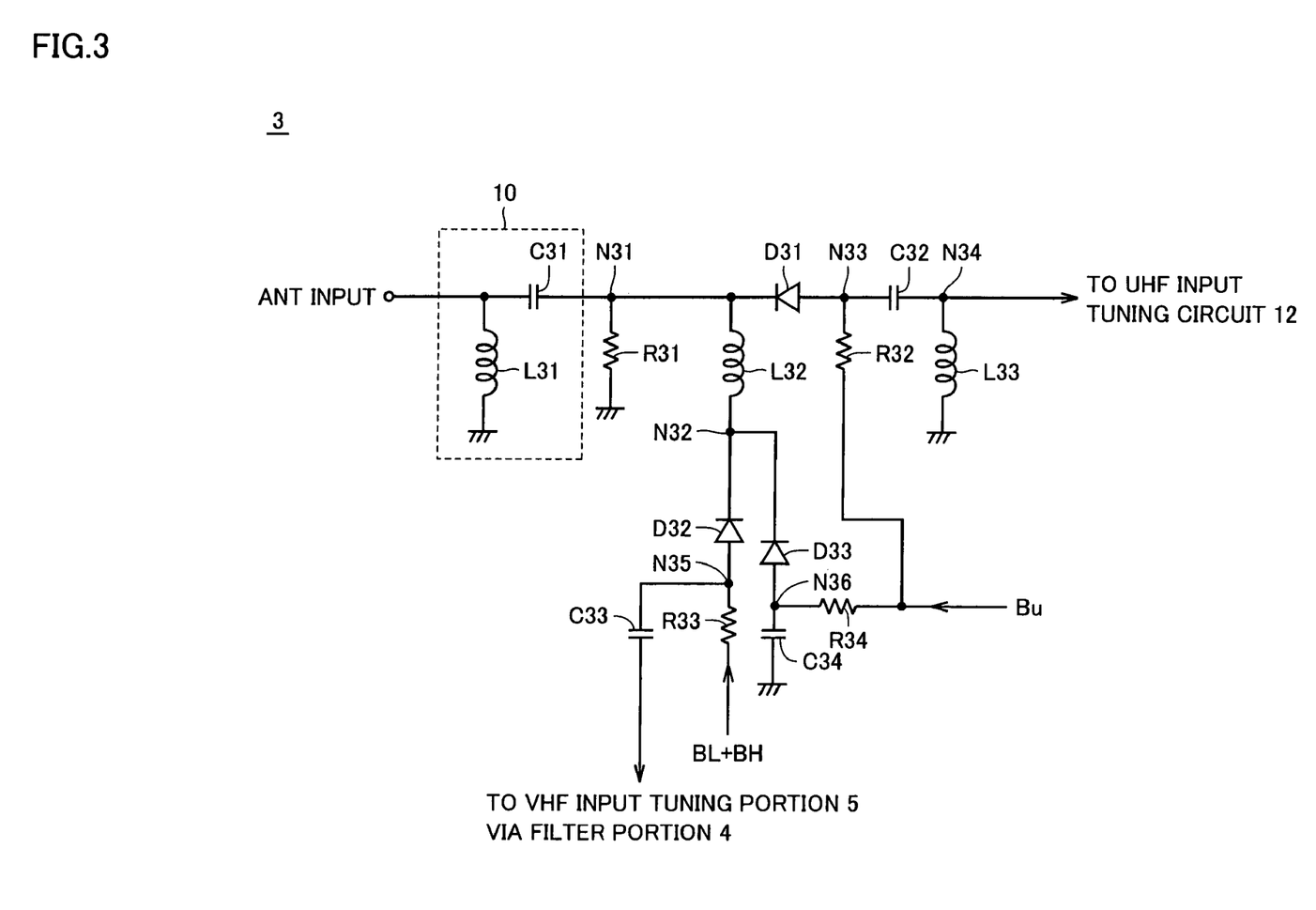
FIG. 3 is a circuit diagram illustrating a specific circuit structure of an antenna input portion 3 according to the embodiment of the invention.

FIG. 3 is a circuit diagram showing a specific circuit structure of antenna input portion 3 according to the embodiment of the invention.

Referring to FIG. 3, antenna input portion 3 includes high-pass filter 10, resistances R31-R34, coils L32 and L33, capacitors C32-C34 and switching diodes (i.e., diodes for switching) D31-D33. High-pass filter 10 includes a coil L31 connected between the ANT (antenna) terminal and the ground node, and a capacitor C31 connected between the ATN terminal and a node N31.

In a conventional tuner of the single conversion type, a high-pass filter (IF filter) is formed of a composite filter (e.g., IF filter 22) having two sections of m-derived high-pass filters and one section of a constant-K high-pass filter.

Tuner 1 according to the embodiment of the invention includes the constant-K high-pass filter 10 in addition to the foregoing composite filter, and therefore can improve the removal ratios with respect to CB interference and IF interference. Thereby, the removal ratio can be improved by 10 dB or more for the CB interference (40 MHz or lower), and the removal ratio can be improved by about 10 dB for the IF interference.

High-pass filter 10 is configured to achieve the cut-off frequency, e.g., of about 30 MHz. Consequently, high-pass filter 10 functions as a discharging circuit when a thunder surge, static electricity or the like is applied to the ANT terminal. In the design of this discharging circuit, use and arrangement of coil L31 are important.

Referring to FIG. 3, resistance R31 is connected between node N31 and the ground node. Switching diode D31 is connected between nodes N31 and N33, and is arranged in the forward direction with respect to node N31. Coil L32 is connected between nodes N31 and N32. Resistance R32 is connected between node N33 and the Bu terminal. The Bu terminal is a power supply terminal for the UHF signal. Capacitor C32 is connected between nodes N33 and N34. Coil L33 is connected between node N34 and the ground node. Node N34 is connected to UHF input tuning circuit 12 (see FIG. 2).

Switching diode D32 is connected between nodes N32 and N35, and is arranged in the forward direction with respect to node N32. Resistance R33 is connected between node N35 and a (BL+BH) terminal. The (BL+BH) terminal is a power supply terminal for the VHF low-band signal and VHF high-band signal. Switching diode D33 is connected between nodes N32 and N36, and is arranged in the forward direction with respect to node N32. Capacitor C34 is connected between node N36 and the ground node. Resistance R34 is connected between node N36 and the Bu terminal. Capacitor C33 is connected between node N35 and filter portion 4, and is connected to VHF input tuning portion 5 via filter portion 4 (see FIG. 2). A circuit operation of antenna input portion 3 will now be described.

In the UHF band operation, the Bu terminal supplies the power supply voltage, and the (BL+BH) terminal does not supply the power supply voltage. Consequently, switching diodes D31 and D33 are turned on, and switching diode D32 is turned off. Description will now be given on a circuit structure of a high-frequency equivalent circuit 3U of antenna input portion 3 in the UHF band operation.

Figure 4:
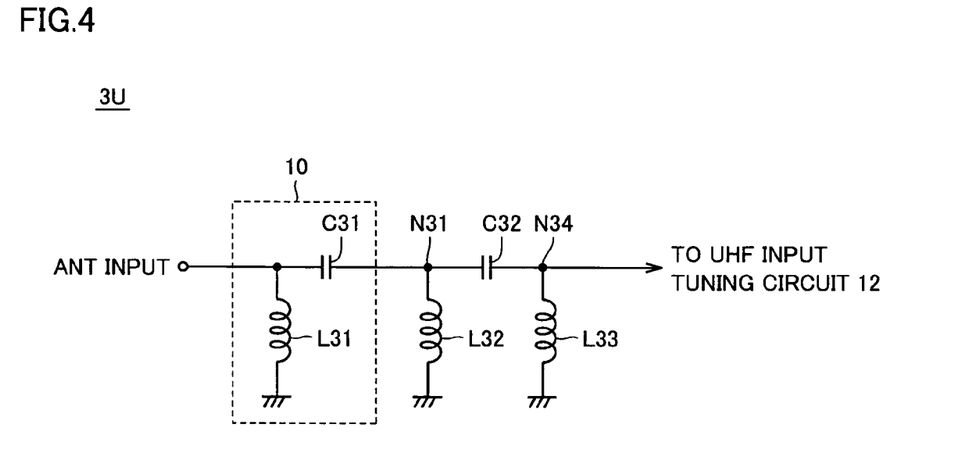
FIG. 4 is a circuit diagram showing a circuit structure of a high-frequency equivalent circuit 3U of an antenna input portion 3 in a UHF band operation.

FIG. 4 is a circuit diagram showing the circuit structure of high-frequency equivalent circuit 3U of antenna input portion 3 in the UHF band operation.

Referring to FIG. 4, high-frequency equivalent circuit 3U of antenna input portion 3 has a high-pass filter 10 (similarly to FIG. 3), coil L32 connected between node N31 and the ground node, capacitor C32 connected between nodes N31 and N34, and coil L33 connected between nodes N34 and the ground node. Node N34 is connected to UHF input tuning circuit 12 (see FIG. 2).

In high-frequency equivalent circuit 3U of antenna input portion 3, coils L32 and L33 as well as capacitor C32 function as a high-pass filter together with high-pass filter 10. Consequently, coils L32 and L33 as well as capacitor C32 regulate the pass band of high-frequency equivalent circuit 3U to the UHF band. In the UHF band operation, therefore, only the UHF signal among the signals applied from the ANT terminal is sent to UHF input tuning circuit 12.

In the VHF band operation, the (BL+BH) terminal supplies the power supply voltage, and the Bu terminal does not supply the power supply voltage. Consequently, switching diode D32 is turned on, and switching diodes D31 and D33 are turned off. The circuit structure of a high-frequency equivalent circuit 3V of antenna input portion 3 in the VHF band operation will now be described.

Figure 5:
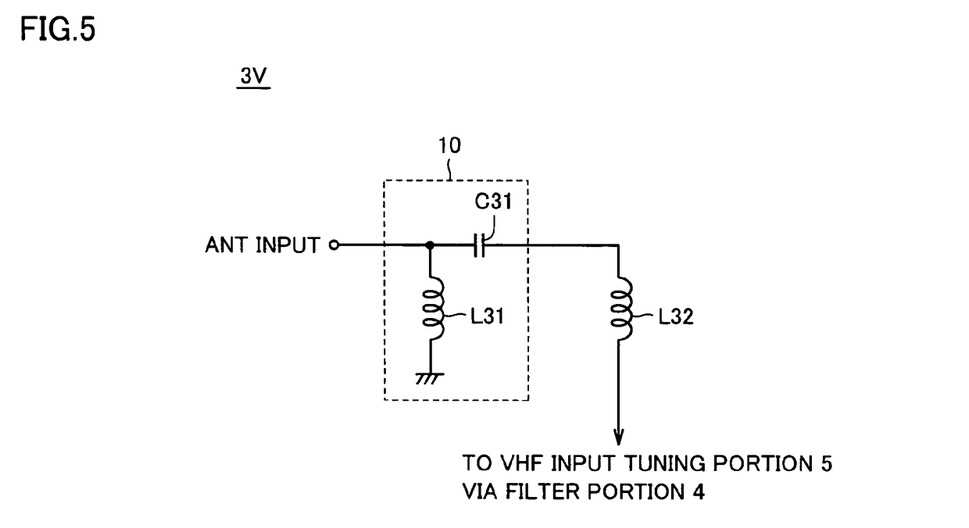
FIG. 5 is a circuit diagram showing a circuit structure of a high-frequency equivalent circuit 3V of the antenna input portion 3 in a VHF band operation.

FIG. 5 is a circuit diagram showing a circuit structure of high-frequency equivalent circuit 3V of antenna input portion 3 in the VHF band operation.

Referring to FIG. 5, high-frequency equivalent circuit 3V of antenna input portion 3 has high-pass filter 10 (similarly to FIG. 3) as well as coil L32 connected between high-pass filter 10 and filter portion 4 (see FIG. 2).

Coil L32 regulates the pass band of high-frequency equivalent circuit 3V of antenna input portion 3 to the VHF band. In the VHF band operation, therefore, only the VHF signal among the signal sent from the ATN terminal is provided to VHF input tuning portion 5 via filter portion 4 (see FIG. 2).

As described above, antenna input portion 3 according to the embodiment of the invention can switch the circuit operation by switching diodes D31-D33 depending on the UHF and VHF bands, and thereby can improve the removal ratio between the UHF signal and the VHF signal by 20 dB or more.

Figure 6:
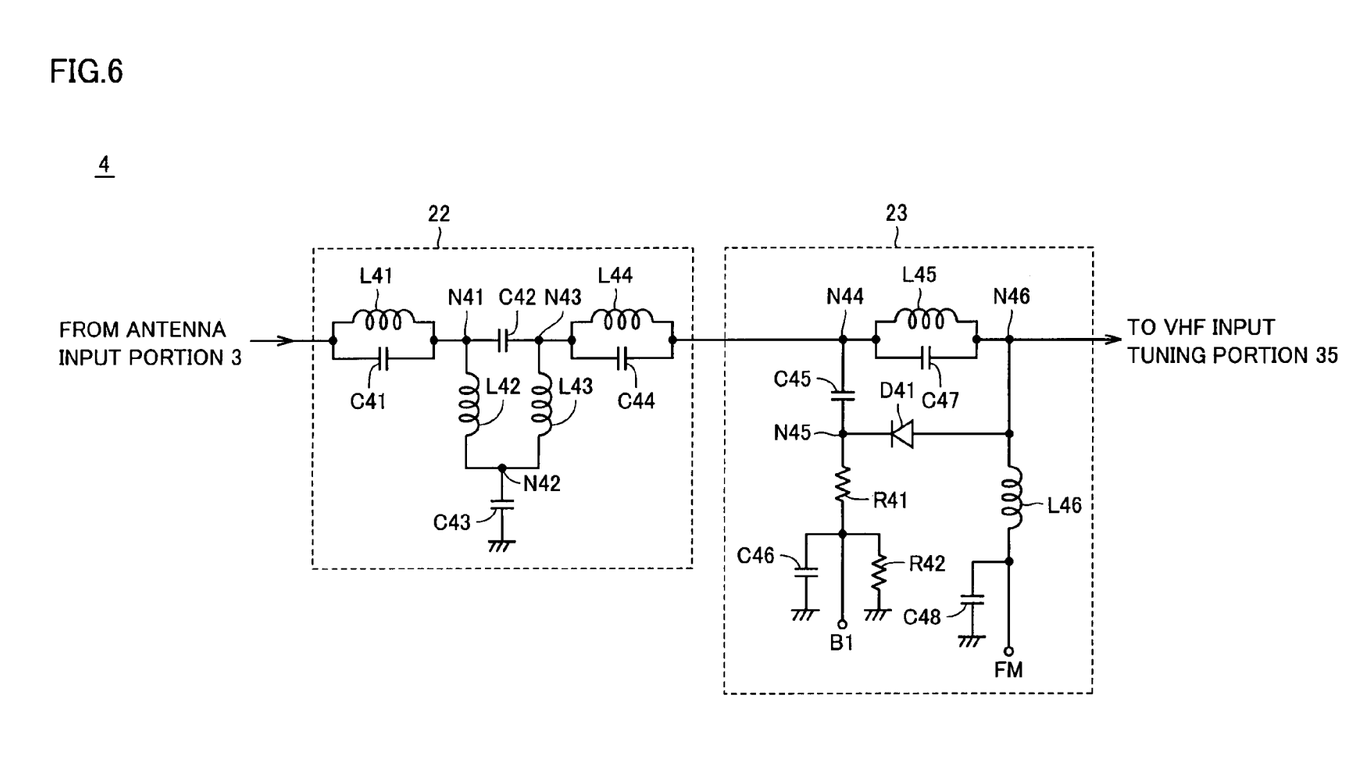
FIG. 6 is a circuit diagram showing a specific circuit structure of a filter portion 4 according to the invention.

FIG. 6 is a circuit diagram showing a specific circuit structure of a filter portion 4 according to the invention.

Referring to FIG. 6, filter portion 4 includes IF filter 22 and FM trap circuit 23. IF filter 22 has coils L41-L44 and capacitors C41-C44. Coil L41 and capacitor C41 are connected in parallel between antenna input portion 3 (see FIGS. 2 and 3) and node N41. Coil L42 is connected between nodes N41 and N42. Capacitor C42 is connected between nodes N41 and N43. Coil L43 is connected between nodes N43 and N42. Capacitor C43 is connected between node N42 and the ground node. Coil L44 and capacitor C44 are connected in parallel between node N43 and FM trap circuit 23 (node N44).

As shown in FIG. 6, IF filter 22 according to the embodiment of the invention is formed of a composite high-pass filter, which is formed of two sections of m-derived high-pass filters and one section of a constant-K high-pass filter. For example, IF filter 22 is configured as a high-pass filter having a cut-off frequency of 50 MHz, a pass band of 54 MHz or higher, and an attenuation of 40 dB or higher in the band of 5 to 46 MHz FM trap circuit 23 includes coils L45 and L46, capacitors C45-C48, resistances R41 and R42, and a switching diode D41.

Coil L45 and capacitor C47 are connected in parallel between nodes N44 and N46, and thus form a parallel resonant structure. Coil L45 and capacitor C47 have constants, which are set to provide the resonant frequency, e.g., of 87 MHz. The parallel resonant structure formed of coil L45 and capacitor C47 is usually configured to have as large a Q value (Quality Factor) as possible so that characteristics of selectivity of the trap in FM trap circuit 23 may be as steep as possible. Setting is determined such that the value of coil L45 is relatively high, and the value of capacitor C47 is relatively low.

However, the value of capacitor C47 is set, e.g., to or around 200 pF in view of the Q value of the capacitor itself Coil L45 is usually formed of an air-core coil because the Q value must be high as already described. The characteristics of the trap by FM trap circuit 23 must be adjusted so that an extreme influence may not be exerted on the characteristics of the neighboring channels on the opposite sides the US6 channel.

Capacitor C45 is a DC blocking capacitor, and is connected between nodes N44 and N45. Capacitor C45 is set, e.g., to 10000 pF. Resistance R41 is connected between node N45 and a B1 terminal. The B1 terminal is a switching terminal supplying the power supply voltage, which switches FM trap circuit 23. Capacitor C46 is a bypass capacitor, and is connected between the B1 terminal and the ground node. Capacitor C46 is set, e.g., to 10000 pF.

Resistance R42 is connected between the B1 terminal and the ground node. Resistances R41 and R42 are resistances for bias resistances switching diode D41. The composite resistance of resistances R41 and R42 must be several times larger than 75 Ω, which is a general impedance of the signal line. In particular, resistance R41 is set, e.g., to 1 KΩ or more. Switching diode D41 is connected between nodes N45 and ND46, and is arranged in the forward direction with respect to node N45.

Coil L46 is connected between node N46 and the FM terminal. The FM terminal is a switching terminal (i.e., terminal for switching), which supplies the power supply voltage switching FM trap circuit 23. Coil L46 has a function as an RF choke coil. Therefore, the calculation is performed on the assumption that a reactance at the resonant frequency of coil L45 and capacitor C47 is several times larger than 75 Ω, which is a general impedance of the signal line.

Capacitor C48 is a bypass capacitor, and is connected between the FM terminal and the ground node. Capacitor C48 is set, e.g., to 1000 pF. Node N46 is connected to VHF input tuning portion 5 (see FIG. 2).

As shown in FIG. 6, FM trap circuit 23 according to the embodiment of the invention includes a parallel resonant structure formed of coil L45 and capacitor C47. FM trap circuit 23 performs the switching control via switching diode D41 to switch FM trap circuit 23 between active and inactive states. A circuit operation of FM trap circuit 23 will now be described.

When the FM terminal supplies the power supply voltage, and the B1 terminal does not supply the power supply voltage, a forward voltage is supplied to switching diode D41 to turn on it. Consequently, the parallel resonant structure formed of coil L45 and capacitor C47 does not operate, and FM trap circuit 23 is disabled (short-circuited).

When the B1 terminal supplies the power supply voltage, and the FM terminal does not supply the power supply voltage, a reverse voltage is applied to switching diode D41 to turn off it. Consequently, the parallel resonant structure formed of coil L45 and capacitor C47 functions, and FM trap circuit 23 is enabled.

As described above, filter portion 4 according to the embodiment of the invention can switch FM trap circuit 23 via switching diode D41 between the active and inactive states. Active/inactive states of FM trap circuit 23 can be switched depending on the operation of receiving the VHF low-band signal and the operation of receiving the US6-channel signal.

When receiving the US6-channel signal, FM trap circuit 23 is enabled to execute the FM trap at or around 90 MHz so that Inter Modulation (IM) distortion on the US6 channel can be improved. Although the IM distortion generally causes secondary and tertiary distortions due to the US6 channel, audio frequency and others, the FM trap inserted into the above frequency region (about 90 MHz) can improve such distortions. Consequently, the beat interference on the US6 channel can be improved by 20 dB or more.

Figure 7:
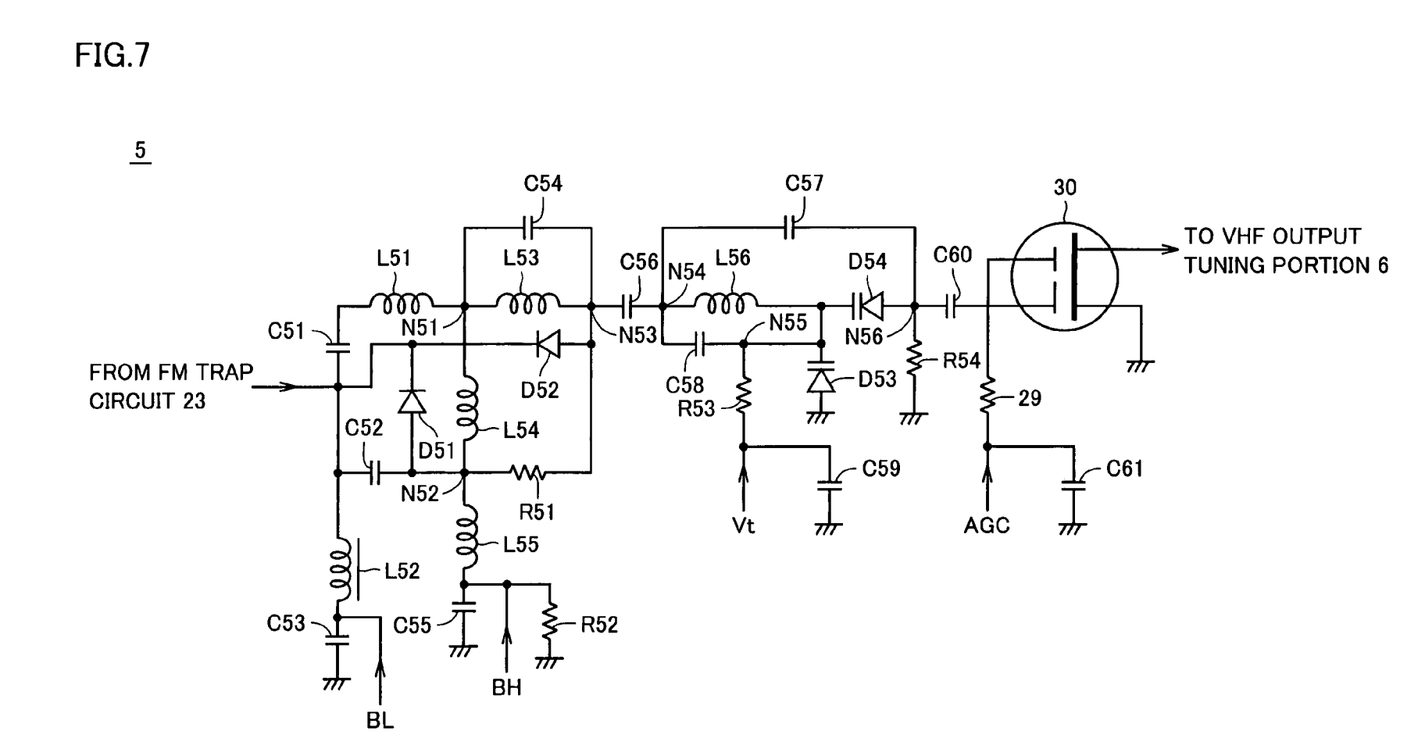
FIG. 7 is a circuit diagram showing a specific circuit structure of a VHF input tuning portion 5 according to the invention.

FIG. 7 is a circuit diagram showing a specific circuit structure of VHF input tuning portion 5 according to the embodiment of the invention.

Referring to FIG. 7, VHF input tuning portion 5 includes capacitors C51-C61, coils L51-L56, resistances R51-R54, AGC resistance 29, switching diodes D51 and D52, a variable-capacitance diode D53 for tuning, a variable-capacitance diode D54 for coupling and VHF high-frequency amplifier (MOS FET) 30.

Capacitor C51 and coil L51 are connected in series between FM trap circuit 23 (see FIGS. 2 and 6) and a node N51. Capacitor C51 is a DC blocking capacitor. Capacitor C52 is connected between FM trap circuit 23 and a node N52. Coil L52 is an RF choke coil, and is connected between FM trap circuit 23 and the BL terminal. The BL terminal is a power supply terminal for the VHF low-band signal. Capacitor C53 is a bypass capacitor, and is connected between the BL terminal and the ground node.

Switching diode D51 is connected between FM trap circuit 23 and node N52, and is arranged in the forward direction with respect to FM trap circuit 23. Capacitor C54 and coil L53 are connected in parallel between nodes N51 and N53. Switching diode D52 is connected between FM trap circuit 23 and node N53, and is arranged in the forward direction with respect to FM trap circuit 23. Coil L54 is connected between nodes N51 and N52.

Resistance R51 is connected between nodes N52 and N53. Coil L55 is connected between node N51 and the BH terminal. The BH terminal is a power supply terminal for the VHF high-band signal. Capacitor C55 is a bypass capacitor, and is connected between the BH terminal and the ground node. Resistance R52 is connected between the BH terminal and the ground node.

Capacitor C56 is the DC blocking capacitor, and is connected between nodes N53 and N54. Capacitor C57 is connected between nodes N54 and N56. Coil L56 is connected between nodes N54 and N55. Capacitor C58 is connected between nodes N54 and N55. Resistance R53 is connected between nodes N55 and the Vt terminal. The Vt terminal is a tuning terminal for VHF input tuning portion 5 and others. Capacitor C59 is a bypass capacitor, and is connected between the Vt terminal and the ground node.

Tuning variable-capacitance diode D53 is connected between node N55 and the ground node, and is arranged in the forward direction with respect to node N55. Coupling variable-capacitance diode D54 is connected between nodes N55 and N56, and is arranged in the forward direction with respect to node N55. Coupling variable-capacitance diode D54 functions also as a matching variable-capacitance capacitor, i.e., variable-capacitance capacitor for matching. An amount of variation of the variable capacitance of coupling variable-capacitance diode D54 in the VHF band is larger than that in the UHF band because the receive frequency in the VHF band is lower than that in the UHF band.

Coupling variable-capacitance diode D54 has a large tuning capacitance on a low end. More specifically, it is assumed that coupling variable-capacitance diode D54 having a minimum capacitance of 4.5 pF provides an SN (Signal to Noise) ratio of 8. In this case, coupling variable-capacitance diode D54 has the tuning capacitance of 36 pF. Thereby, the effective Q value increases and a mismatch loss increases so that a noise figure and an inter-channel sensitivity deviation are deteriorated. Provision of coupling variable-capacitance diode D54 can suppress the deterioration of the noise figure and the channel sensitivity deviation.

Resistance R54 is connected between node N56 and the ground node. VHF high-frequency amplifier (MOS FET) 30 has a source connected to the AGC terminal via AGC resistance 29, a drain connected to node N56 via capacitor C60, and a back gate connected to the ground node. Capacitor C60 is the DC blocking capacitor. The AGC terminal receives the gain control signal from a video signal demodulating circuit (not shown). Capacitor C61 is a bypass capacitor, and is connected between the AGC terminal and the ground node. A gate of MOS FET 30 is connected to VHF output tuning portion 6 (see FIG. 2). A circuit operation of VHF input tuning portion 5 will now be described.

In a VHF high-band operation, the BH terminal supplies the power supply voltage, and the BL terminal does not supply the power supply voltage. Consequently, both switching diodes D51 and D52 are turned on. A circuit structure of a high-frequency equivalent circuit 5H of the VHF input tuning portion 5 in the VHF high-band operation will now be described.

Figure 8:
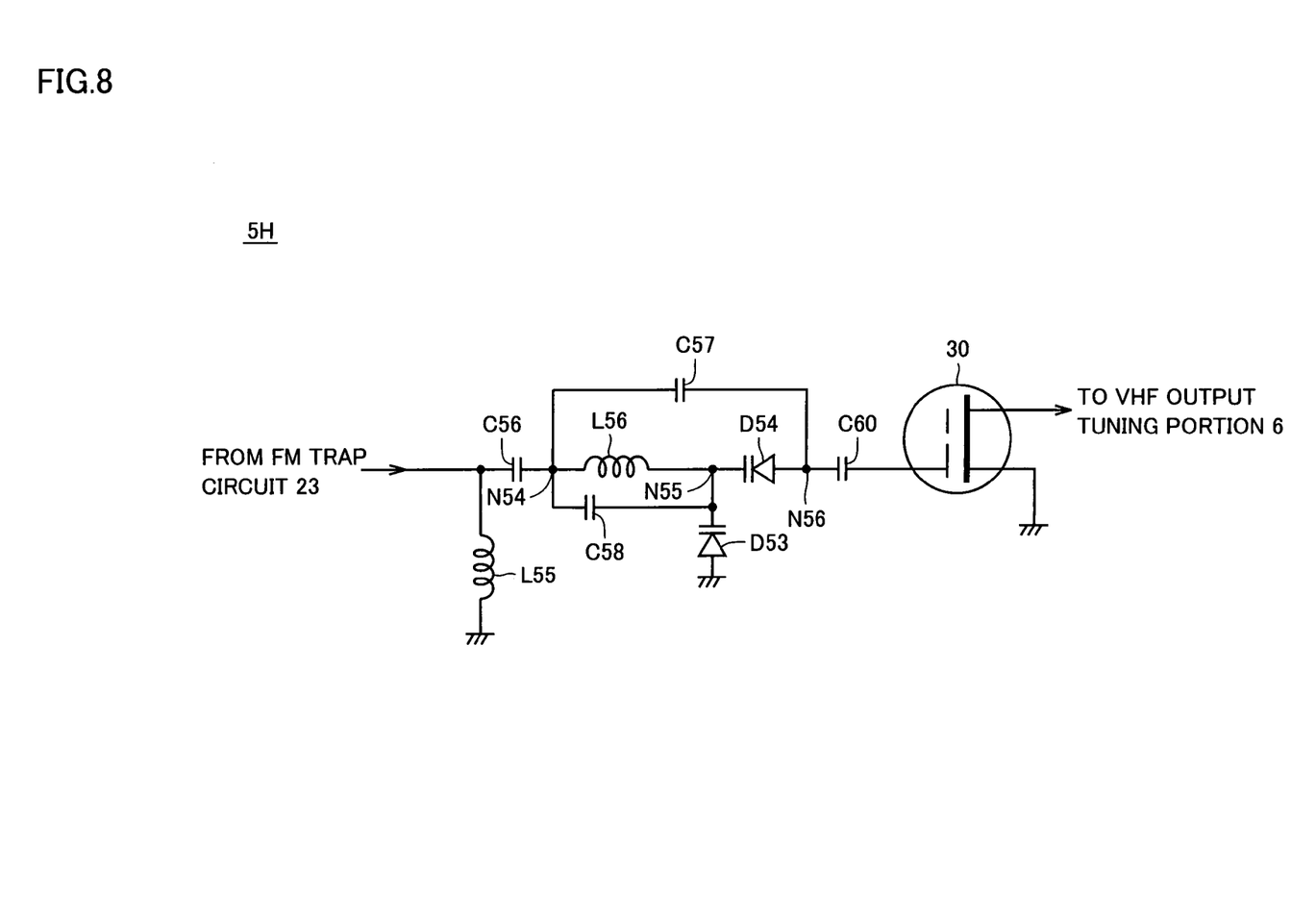
FIG. 8 is a circuit diagram showing a circuit structure of a high-frequency equivalent circuit 5H of the VHF input tuning portion 5 in a VHF high-band operation.

FIG. 8 is a circuit diagram showing a circuit structure of high-frequency equivalent circuit 5H of VHF input tuning portion 5 in the VHF high-band operation.

Referring to FIG. 8, high-frequency equivalent circuit 5H of VHF input tuning portion 5 includes coils L55 and L56, capacitors C56-C58 and C60, tuning variable-capacitance diode D53, coupling variable-capacitance diode D54 and VHF high-frequency amplifier (MOS FET) 30.

Coil L55 is connected between FM trap circuit 23 (see FIGS. 2 and 6) and the ground node. Capacitor C56 is a DC blocking capacitor, and is connected between FM trap circuit 23 and node N54. Capacitor C57 is connected between nodes N54 and N56. Coil L56 is connected between nodes N54 and N55. Capacitor C58 is connected between nodes N54 and N55.

Tuning variable-capacitance diode D53 is connected between node N55 and the ground node, and is arranged in the forward direction with respect to node N55. Coupling variable-capacitance diode D54 is connected between nodes N55 and N56, and is arranged in the forward direction with respect to node N55. VHF high-frequency amplifier (MOS FET) 30 has a drain connected to node N56 via capacitor C60, and a back gate connected to the ground node. Capacitor C60 is a DC blocking capacitor. A gate of MOS FET 30 is connected to VHF output tuning portion 6 (see FIG. 2).

In the VHF high-band operation, coil L32 in the high-frequency equivalent circuit 3V of antenna input portion 3, which is already described with reference to FIG. 5, serves as a matching inductor. Referring to FIG. 8, coils L55 and L56, which are connected in series, serve as a tuning inductor, of which tuning capacitance is equal to the capacitance of tuning variable-capacitance diode D53.

Capacitor C57 forms a loop together with coil L56 and coupling variable-capacitance diode D54, and performs image trapping of the VHF high band. The value of capacitor C57 must be determined such that the image trap may follow through the whole VHF high-band region because coupling variable-capacitance diode D54 has the variable capacitance. Capacitor C58 functions as a capacitor for tracking correction. More specifically, capacitor C58 is connected in parallel with coil L56 so that the inductance of coil L56 equivalently decreases. Therefore, variations of the tuning frequency can be suppressed.

In the VHF low-band operation, the BL terminal supplies the power supply voltage, and the BH terminal does not supply the power supply voltage. Consequently, both switching diode D51 and D52 are turned off. A circuit structure of a high-frequency equivalent circuit 5L of VHF input tuning portion 5 in the VHF low-band operation will now be described.

Figure 9:
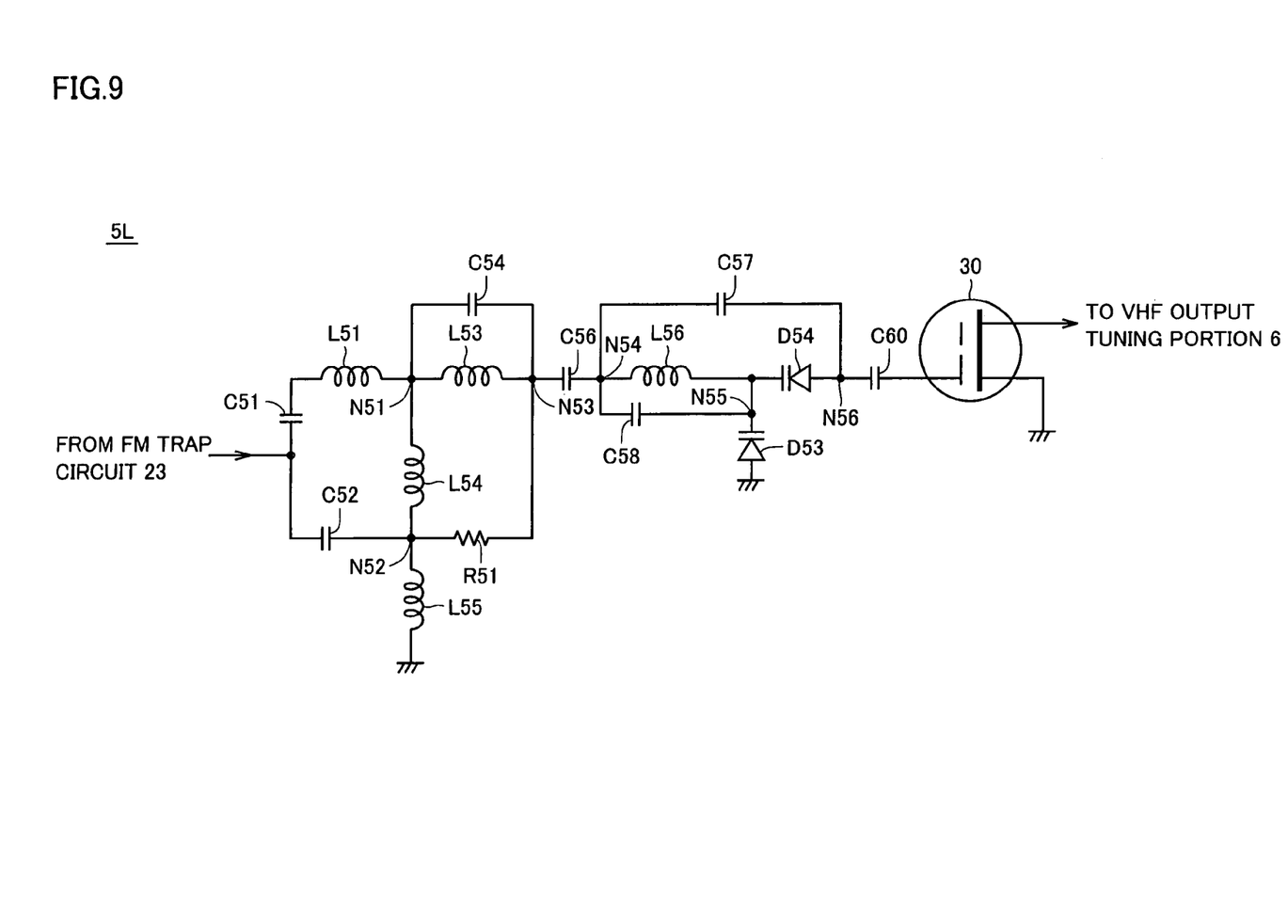
FIG. 9 is a circuit diagram showing a circuit structure of a high-frequency equivalent circuit 5L of the VHF input tuning portion 5 in a VHF low-band operation.

FIG. 9 is a circuit diagram showing a circuit structure of high-frequency equivalent circuit 5L of VHF input tuning portion 5 in the VHF low-band operation.

Referring to FIG. 9, high-frequency equivalent circuit 5L of VHF input tuning portion 5 includes capacitors C51, C52, C54, C56-C58 and C60, coils L51, L53-L56, resistance R51, tuning variable-capacitance diode D53, coupling variable-capacitance diode D54 and VHF high-frequency amplifier (MOS FET) 30.

Capacitor C51 and coil L51 are connected in series between FM trap circuit 23 (see FIGS. 2 and 6) and node N51. Capacitor C51 is a DC blocking capacitor. Capacitor C52 is connected between FM trap circuit 23 and node N52. Capacitor C54 and coil L53 are connected in parallel between nodes N51 and N53.

Coil L54 is connected between nodes N51 and N52. Coil L55 is connected between node N51 and the ground node. Resistance R51 is connected between nodes N52 and N53. Capacitor C56 is a DC blocking capacitor, and is connected between nodes N53 and N54. Capacitor C57 is connected between nodes N55 and N56. Coil L56 is connected between nodes N54 and N55. Capacitor C58 is connected between nodes N54 and N55.

Tuning variable-capacitance diode D53 is connected between node N55 and the ground node, and is arranged in the forward direction with respect to node N55. Coupling variable-capacitance diode D54 is connected between nodes N55 and N56, and is arranged in the forward direction with respect to node N55. VHF high-frequency amplifier (MOS FET) 30 has a drain connected to node N56 via capacitor C60 and a back gate connected to the ground node. Capacitor C60 is a DC blocking capacitor. MOS FET 30 has a gate connected to VHF output tuning portion 6.

In the VHF low-band operation, coil L51 operates as a matching inductor. Further, coils L53-L56 connected in series substantially operate as a matching inductor, of which tuning capacitance is equal to the capacitance of tuning variable-capacitance diode D53.

Capacitor C54 and coil L53 form a parallel circuit, and provide an image trap. Capacitor C52 and coils L51 and L55 form an m-derived low-pass filter, and reduce the cut-off characteristics in a high frequency region equal to or higher than the image frequency. Resistance R51 serves as a damping resistance, and operates to suppress a deviation of the sensitivity and to correct the band characteristics in the VHF high-band operation. However, the resistance value of resistance R51 must be determined carefully because inappropriate resistance values deteriorate a noise figure.

As described above, VHF input tuning portion 5 according to the embodiment of the invention can switch the circuit operation via switching diodes D51 and D52 in accordance with the high/low bands of the VHF band.

In the operation of receiving the VHF high-band, coil L32 in high-frequency equivalent circuit 3V of antenna input portion 3, which is already described with reference to FIG. 5, serves as a matching inductor. This remarkably improves the selectivity characteristics on the high-frequency side with respect to interference signals. This improves the interference signal removing ratio and image rejection ratio in the operation of receiving the VHF high-band signal.

By employing capacitor C57 in VHF input tuning portion 5, a resonant structure is formed between coil L56 and coupling variable-capacitance diode D54 in the VHF high-band receiving operation. Thereby, a variable image trap circuit is formed, and an image removing ratio is remarkably improved in the VHF high-band receiving operation. By reducing the influence of the image signal on the desired signal, the image rejection ratio can be improved from a conventional value of about −50 dBc to a value of −55 dBc or lower.

By employing capacitor C58 in VHF input tuning portion 5, capacitor C58 can control the variable range of the capacitance of tuning variable-capacitance diode D53. This improves the tracking characteristics between high-frequency amplifier circuit 2 and VHF local oscillator circuits 37 and 38 in the VHF high-band receiving operation.

In the VHF low-band receiving operation, the m-derived low-pass filter formed of filter capacitor C52 and coils L51 and L55 operates in VHF input tuning portion 5. This can reduce the influence of the interference signals in the VHF high-band and the UHF band as well as the influence of the image signal on the desired signal.

Capacitor C54 employed in VHF input tuning portion 5 forms a parallel circuit with respect to coil L53 in the VHF low-band receiving operation. Thereby, an image trap circuit is formed, and the image rejection ratio is remarkably improved.

By reducing the influence of the interference signal in the VHF high-band and the UHF band, the relative ratio in selectivity between the receive channel and the interference channel can be improved from a conventional value of about −10 dBc to a value of −40 dBc or lower. By reducing the influence of the image signal on the desired signal, the image rejection ratio can be improved from a conventional value of about −50 dBc to a value of −55 dBc or lower.

According to tuner 1 of the embodiment of the invention, as described above, the circuit operation in antenna input portion 3 can be switched via switching diodes D31-D33 depending on the UHF/VHF bands. In filter portion 4, FM trap circuit 23 can be switched via switching diode D41 between the active/inactive states. In VHF input tuning portion 5, the circuit operation can be switched via switching diodes D51 and D52 depending on the high/low bands of the VHF band.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A receiver device employing a single conversion system comprising:
  a high-frequency amplifier circuit performing high-frequency amplification of an input signal received from an antenna terminal; and
  a signal processing portion performing frequency conversion and amplification of a high-frequency signal provided from said high-frequency amplifier circuit, wherein
  said high-frequency amplifier circuit includes:
  an antenna input portion passing a high-frequency component of said input signal, and then performing switching depending on a first frequency band and a second frequency band lower than said first frequency band,
  an IF filter portion performing high pass filtering processing on a signal in said second frequency band selected by said antenna input portion, and
  a second frequency band input tuning portion tuning and amplifying the signal in said second frequency band filtered by said filter portion.

2. The receiver device according to claim 1, wherein said antenna input portion includes:
  a high-pass filter passing the high frequency component of said input signal, and
  an input switching circuit extracting a signal in said first frequency band from the signal passed through said high-pass filter when a power supply voltage for said first frequency band is supplied, and extracting a signal in said second frequency band from the signal passed through said high-pass filter when a power supply voltage for said second frequency band is supplied.

3. The receiver device according to claim 1, wherein said filter portion includes:
  an IF filter passing the high-frequency component of the signal in said second frequency band extracted by said antenna input portion, and
  a trap circuit performing resonant trap by a parallel resonant structure on the signal in said second frequency band passed through said IF filter, and
  said trap circuit is disabled as a result of non-operation of said parallel resonant structure when a power supply voltage is supplied from a first switching terminal, and is enabled as a result of operation of said parallel resonant structure when the power supply voltage is supplied from a second switching terminal.

4. The receiver device according to claim 1, wherein said second frequency band input tuning portion functions as a matching inductor together with said antenna input portion when a power supply voltage for a high band in said second frequency band is supplied, and functions as an m-derived low-pass filter when the power supply voltage for a low band in said second frequency band is supplied.

5. The receiver device according to claim 1, wherein said second frequency band input tuning portion is provided with a variable image trap circuit when a power supply voltage for a high band in the second frequency band is supplied, and is provided with an fixed image trap circuit when the power supply voltage for a low band in said second frequency band is supplied.

6. The receiver device according to claim 1, wherein said second frequency band input tuning portion includes a capacitor for correcting characteristics of tracking between said high frequency amplifier circuit and said signal processing portion when a power supply voltage for a high band in said second frequency band is supplied.

7. The receiver device according to claim 1, wherein said first frequency band is a UHF band.

8. The receiver device according to claim 1, wherein said second frequency band is a VHF band.

* * * * *